US011455020B2

(12) United States Patent
Chhuor et al.

(10) Patent No.: US 11,455,020 B2
(45) Date of Patent: Sep. 27, 2022

(54) COMPUTING DEVICE, APPARATUS FOR HOLDING POWER SUPPLY DEVICE, AND METHODS OF INSTALLING POWER SUPPLY DEVICE IN COMPUTING DEVICE

(71) Applicant: Lenovo Enterprise Solutions (Singapore) Pte. Ltd., New Tech Park (SG)

(72) Inventors: CheKim Chhuor, Shanghai (CN); Zhipeng Gao, Shanghai (CN); Gregory Wallace Roth, Durham, NC (US)

(73) Assignee: Lenovo Enterprise Solutions (Singapore) Pte. Ltd., New Tech Park (SG)

( * ) Notice: Subject to any disclaimer, the term of this patent is extended or adjusted under 35 U.S.C. 154(b) by 303 days.

(21) Appl. No.: 16/808,918

(22) Filed: Mar. 4, 2020

(65) Prior Publication Data
US 2020/0293100 A1 Sep. 17, 2020

(30) Foreign Application Priority Data
Mar. 6, 2019 (CN) .......................... 201910169020.4

(51) Int. Cl.
| | |
|---|---|
| G06F 11/00 | (2006.01) |
| G06F 1/26 | (2006.01) |
| G06F 11/07 | (2006.01) |
| G06F 13/16 | (2006.01) |
| H05K 7/14 | (2006.01) |

(52) U.S. Cl.
CPC .......... *G06F 1/263* (2013.01); *G06F 11/0727* (2013.01); *G06F 11/0751* (2013.01); *G06F 11/0772* (2013.01); *G06F 13/1668* (2013.01); *H05K 7/1489* (2013.01); *H05K 7/1492* (2013.01); *H05K 7/1494* (2013.01)

(58) Field of Classification Search
CPC ..................... G06F 11/0727; G06F 11/0751
See application file for complete search history.

(56) References Cited

U.S. PATENT DOCUMENTS

| | | | | |
|---|---|---|---|---|
| 2003/0016504 | A1* | 1/2003 | Raynham | H05K 7/1487 |
| 2015/0120874 | A1* | 4/2015 | Kim | H04L 67/1097 |
| | | | | 709/218 |

* cited by examiner

*Primary Examiner* — Amine Riad
(74) *Attorney, Agent, or Firm* — Olive Law Group, PLLC

(57) ABSTRACT

The present invention provides a computing device, apparatus for holding a power supply device, and methods of installing a power supply device in the computing device. The apparatus comprises a container and at least one electrical contact disposed on the container. The container is configured to hold the power supply device and to be received in a receiving space defined by the computing device. The container, when received in the receiving space, is operable to be removed from the receiving space without necessity of opening a cover of the computing device. The apparatus, computing device, and methods are advantageous in various aspects such as being favorable to the lifetime of the power supply device, convenient for uses to manage the power supply device, such as monitoring the status and make replacement when necessary, etc.

18 Claims, 3 Drawing Sheets

COMPUTING DEVICE, APPARATUS FOR HOLDING POWER SUPPLY DEVICE, AND METHODS OF INSTALLING POWER SUPPLY DEVICE IN COMPUTING DEVICE

CROSS REFERENCE TO RELATED APPLICATION

This application claim priority to Chinese Patent Application No. 201910169020.4, filed on Mar. 6, 2019, and titled COMPUTING DEVICE, APPARATUS FOR HOLDING POWER SUPPLY DEVICE, AND METHODS OF INSTALLING POWER SUPPLY DEVICE IN COMPUTING DEVICE; the content of which is hereby incorporated by reference herein in its entirety.

FIELD OF THE INVENTION

The present invention generally relates to power management for computing devices, and more particularly, to a computing device, apparatus for holding a power supply device, and methods of installing a power supply device in the computing device.

BACKGROUND

A computing device, such as a server, often requires a battery for backup purposes, such as to protect cache memory on Peripheral Component Interconnect (PCI) Redundant Array of Independent Disks (RAID) controllers. The battery is conventionally installed inside a server chassis, such as being clipped on the chassis wall or on air baffle. This is problematic in a number of aspects. For example, the conventional arrangement is unfavorable for heat dissipation, which degrades lifetime of the battery. It is also inconvenient for users to replace the battery because in doing so, they have to shut down the computing device, and open the cover, such as the chassis. As a result, replacement of the battery interrupts the normal operation of the computing device. Many users are intimidated by such a cumbersome task and instead simply doing nothing but wait until the battery is unable to function.

SUMMARY

The present invention provides a computing device, apparatus for holding a power supply device, and methods of installing a power supply device in the computing device to overcome one or more technical problems present in the conventional technology.

According to one aspect of exemplary embodiments, there is provided an apparatus for holding a power supply device. The power supply device is operable to power a computing device. The apparatus comprises a container and at least one electrical contact disposed on the container. The container is configured to hold the power supply device and to be received in a receiving space defined by the computing device. The container, when received in the receiving space, is operable to be removed from the receiving space without necessity of opening a cover of the computing device.

According to another aspect of exemplary embodiments, there is provided with a computing device. The computing device comprises a Redundant Array of Independent Disks (RAID) controller, a baseboard management controller (BMC) configured to communicate with the RAID controller, and a backplane. The backplane is configured to communicate with the RAID controller and the BMC and includes one or more connectors. The one or more connectors are operable to electrically contact one or more pins of an apparatus for holding a power supply device. The computing device further defines a receiving space configured to receive the apparatus. When the apparatus, with the power supply device, is received in the receiving space, status of the power supply device is readable by the BMC via the RAID controller.

According to a yet further aspect of exemplary embodiments, there is provided with a method of installing a power supply device in a computing device. The method comprises providing an apparatus for holding the power supply device, the apparatus including a container and at least one electrical contact, and installing the apparatus into a receiving space defined by the computing device such that the at least one electrical contact electrically communicates with the computing device.

The apparatus, computing device, and methods in accordance with exemplary embodiments improve over the existing technology in various aspects, such as being favorable to lifetime of the power supply device, convenience to monitor various status related to the power supply device (e.g. capacity, health status, etc.) directly on the front panel of the power supply device, and make replacement when necessary. Further, the apparatus in accordance with some exemplary embodiments are compatible with existing arrangement of computing devices. For example, the apparatus may be placed into a storage bay that is originally designed to hold one or more hard disks. As such, a battery pack, for example, may be held by the apparatus that is inserted into a hard disk slot of a server to power the server, which is technically advantageous on one hand and cost-effective on the other hand.

For example, conventional systems include slots that are designed to receive one or more hard disks and none of them can hold a power supply device for powering a computing device, such as a computer server. Instead, the battery has to be disposed within the computer server, such as being installed inside the server chassis. In operation, under such unfavorable ventilation condition and also due to high workload of the server, temperature of the battery stays readily high and therefore lifetime of the battery is seriously compromised. Also, status of the battery is unknown to an external observer and replacement of the battery is cumbersome because one has to open the cover of the computer server. One or more of these issues have been overcome by the present implementations. For example, by means of the apparatus, a power supply device can be placed in a receiving space defined by the computing device. The position of the illustrative receiving space in accordance with present implementations is obviously much more favorable because it is not in a hot area of a computing device (i.e. not an area where heat is mostly generated) on one hand, and on the other hand, this position is also at least partly in air communication with surroundings, thereby facilitating heat dissipation.

For the present implementations, it is also convenient for a user to install or replace a power supply device. For example, one may easily push the apparatus with the power supply device into a slot to complete the installation, or pull the apparatus out of the slot for replacement. In either scenario, one does not need to open a cover of the computing device as well as rearrange various cables. The present implementations thus save time and efforts, and also avoid damages to the computing device due to potential accidental operation during installation and replacement processes.

Further, in conventional systems, users or operators are often unwilling to take action to replace battery. However, when capacity of the battery is below a certain value, there would be risks that the computing device may be shut down suddenly due to depletion of power, which likely result in data loss. Because of technical advantages of the present implementations, users are more willing to replace the power supply device for the computing device, which therefore alleviates risks of data loss. Further, due to the operation panel, various status related to the power supply device can be presented visually and/or audibly, which enables improved power management for the computing device More exemplary embodiments and technical effects will be discussed hereinafter.

BRIEF DESCRIPTION OF THE DRAWINGS

Embodiments of the present invention will now be described, by way of example, with reference to the accompanying drawings in which.

DETAILED DESCRIPTION

As used herein, a "computing device" may be a computer, a computer server, or other kinds of computing devices.

As used herein, a "power supply device" is operable to supply power for a computing device. The power supply device may be an electric battery or battery pack or supercapacitor. The battery or battery pack may be rechargeable or non-rechargeable.

As used herein, a "receiving space" is a space that is defined by one or more parts or portions of a computing device, and when not being occupied, the receiving space may be partly viewable from its surroundings, such as with one or more openings facing external surroundings. The receiving space, for example, may include one or more storage bays (e.g. one or more slots).

As used herein, a "container" is an object for holding or transporting an item. The container defines a space that may be open-ended or close-ended when the item is completely installed in the container. The container may or may not include a casing or housing. The container, for example, may be in a form of box or tray. The container may also be a housing or casing or covering for a power supply device, such as a battery housing. In some situations, the container may be part of a power supply device; that is, the power supply device may be integrally into the shape of the container.

Figure 1:
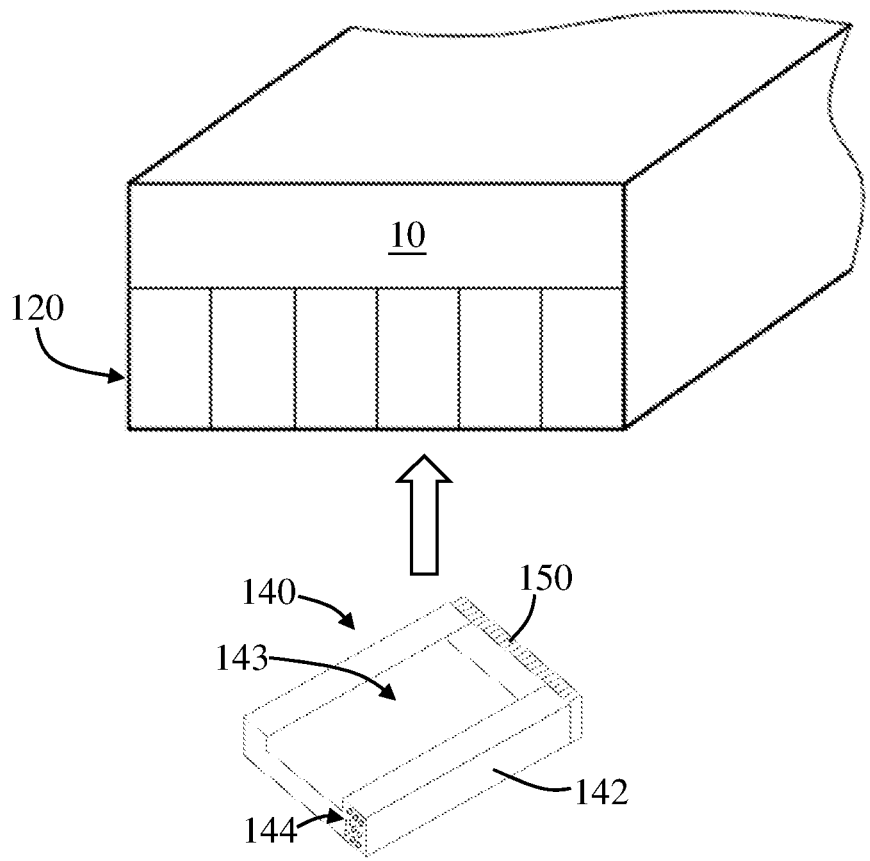
FIG. 1 illustrates an apparatus for holding a power supply device operable to power a computing device in accordance with an embodiment.

According to an embodiment of the invention, FIG. 1 illustrates an apparatus 140 for holding a power supply device. The power supply device is operable to supply power for a computing device 10. The apparatus 140 includes a container 142. The container 142 is configured to hold the power supply device. The power supply device may be held or placed in a space 143 defined by the container 142. The container 142 may be received in the receiving space 120 (which is illustrated as including six slots) defined by the computing device 10 so as to dispose the power supply device in the right place to power the computing device 10. The container 142 may be a mechanical tray or other proper container means. The container 142, when received in the receiving space 120, is operable to be removed from the receiving space 120 without necessity of opening a cover of the computing device 10. For example, the container 142 may be conveniently slide into (such as along the arrow's direction) and pulled out of the receiving space 120. The cover may be a casing or housing of the computing device or a casing or housing of a certain portion of the computing device.

As illustrated, at least one electrical contact 144 is disposed on a face of the container 142. The electrical contact 144 includes one or more connectors or pins, such as magnetic pins. In operation, the electrical contact 144 allows status of the power supply device to be detectable by the computing device 10. When the apparatus 140, with the power supply device loaded within its container 142, is placed into the receiving space 120, the electrical contact 144 electrically couples to the computing device 10, thereby enabling electrical communication between the power supply device and the computing device 10. An operation panel 150 is further arranged on a face of the container 140 as illustrated, which enable status of the power supply device to be presented.

Figure 2:
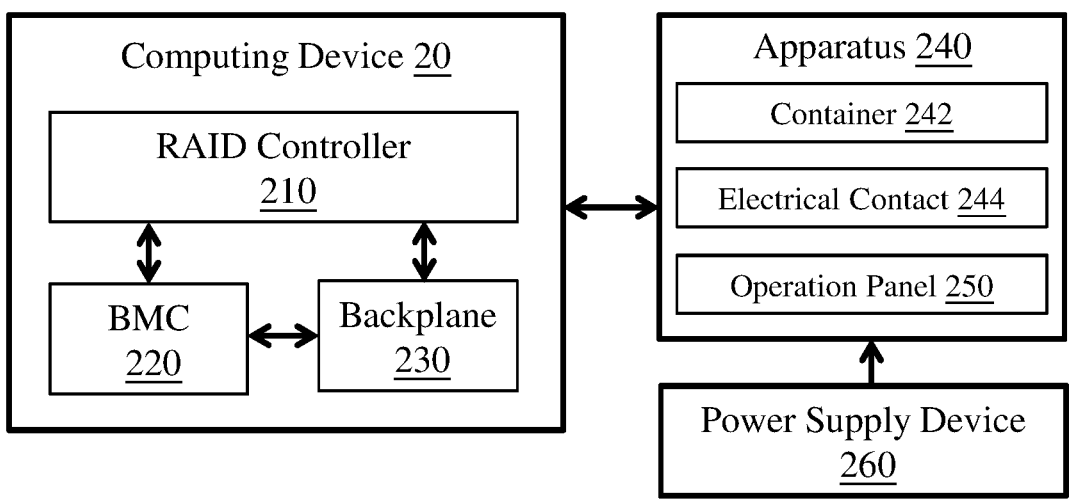
FIG. 2 illustrates a computing device and an apparatus for holding a power supply device operable to power the computing device in accordance with another embodiment.

According to another embodiment, FIG. 2 illustrates a computing device 20 and an apparatus 240 for holding a power supply device 260. The computing device 20 and the apparatus 240 can be applied to the implementations as illustrated in FIG. 1. As illustrated in FIG. 2, the computing device 20 includes a Redundant Array of Independent Disks (RAID) controller 210, a baseboard management controller (BMC) 220, and a backplane 230. The BMC 220 communicates with the RAID controller 210, for example, by means of Management Component Transport Protocol (MCTP) communication over a Peripheral Component Interconnect Express (PCIe) bus. The backplane 230 communicates with the RAID controller 210 and the BMC 220 via one or more wires or cables. The backplane 230 includes one or more connectors or pins. The pins, such as magnetic pins, are operable to electrically contact the electrical contact 244 of the apparatus 240. When the apparatus 240 holds the power supply device 260 and is received in a receiving space (such as a slot) of the computing device 20, electrical connectivity is established to enable the BMC 220 to obtain status of the power supply device 260 via the RAID controller 210. For example, there may be several magnetic pins arranged on a tray for residing a power supply device. On a given slot of the backplane, there are some pins which can connect to the magnetic pins on the tray. Once the tray is received in the slot, the electrical connection is established. In this way, the slot is compatible for both a tray for holding a power supply device and a drive tray for holding a hard drive.

As illustrated in FIG. 2, the apparatus 240 includes an operation panel 250. The operation panel 250 includes one or more indicators operable to indicate status of or status related to the power supply device 260. The operation panel 250 is disposed at a proper position of the apparatus 240. The operation panel 250, for example, may be arranged on a face of the container 242 such that when the container 242 is received in a receiving space defined by the computing device 20, the one or more indicators are observable or viewable by an external observer. The external observer may be a person standing near the computing device 20 and facing the operation panel 250.

The operation panel 250 is operable to communicate with the BMC 220. The operation panel 250 may be electrically connected to (e.g. wired to) a connector of the apparatus 240. The connector, for example, may be one of the at least one electrical contact 244. For example, there may be two wires or cables drawn out from the electrical contact 244. One cable is connected to the power supply device as received in the container 242, and the other one is connected to the operation panel 250. When the apparatus 240 is placed into a receiving space, the operation panel 250 is electrically connected to the backplane 230 and accordingly to the BMC 220 via the electrical connectivity established (e.g. through a wire or cable) between the backplane 230 and the BMC 220. In operation, the BMC 220, in accordance with the status of the power supply device 260, may communicate with the operation panel 250 such that the one or more indicators responsively show correct or updated indications of the status.

The operation panel 250 provides an interactive interface for users and may be flexibly implemented. The operation panel 250 may include a liquid crystal display (LCD). The LCD may be designed with touch input capability to enable touch input by users. As such, one or more indicators may be implemented by means of icons whose colors or shapes may be actuated or varied in accordance with variations of various status of the power supply device 260 so as to perform functions of indicating. The icons may be software-implemented with proper programing or hardware-implemented with electrical circuitry. The LCD may include other icons to expand interactive activities between users and the computing device. Alternatively, the operation panel 250 may include one or more light emitting diodes (LED) actuators or buttons. Each actuator indicates a respective aspect of the status. Status in certain aspect is indicated by operation or actuation of respective actuator, such as by changing colors (blue, red, yellow, etc.), patterns (intensity unchanged, weakened, or strengthened, blinking with certain frequency, etc.), or combination thereof.

Figure 3:
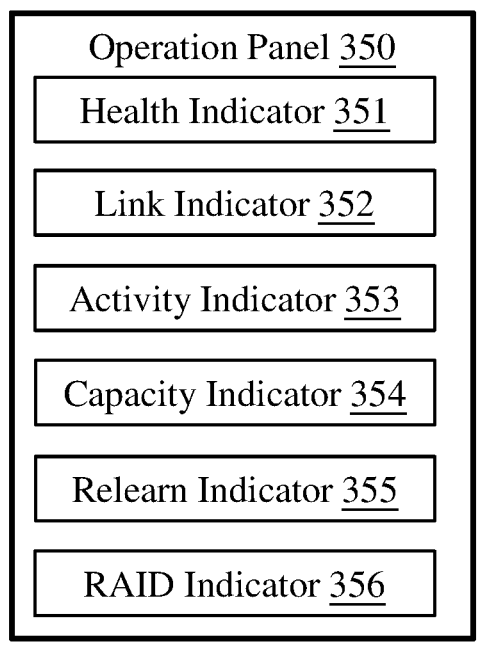
FIG. 3 illustrates an operation panel in accordance with an embodiment.

FIG. 3 illustrates an exemplary design of an operation panel 350. The operation panel 350 may be a specific implementation of the operation panel 250 in FIG. 2. As illustrated in FIG. 3, the operation panel 50 includes a health indicator 351, a link indicator 352, an activity indicator 353, a capacity indicator 354, a relearn indicator 355, and a RAID indicator 356. The health indicator 351 is operable to indicate health status of a power supply device, such as whether the power supply device is under normal working condition or there is something wrong (e.g. failure) with the power supply device. The link indicator 352 is operable to indicate a link status of the power supply device. The link status indicates whether electrical connectivity between the power supply device and the RAID controller of the computing device is established to allow the status of the power supply device to be detectable by the RAID controller. That is, the link indicator 352 informs users of the connectivity readiness of the power supply device. The link indicator 352 is able to show whether an apparatus (such as the apparatus 140 or 240) is firmly placed or inserted in the receiving space and also the acknowledgement of the RAID controller. The activity indicator 353 is operable to indicate whether the power supply device is powering the computing device. The activity indicator 353 may keep on blinking to tell users that the power supply device is working to supply power at this moment and thus warn uses not to remove the apparatus from the receiving space. The capacity indicator 354 is operable to indicate a current capacity of the power supply device, such as whether the current capacity is below a predefined threshold. The capacity indicator 354 may also indicate the progress of a relearn cycle for the power supply device. During the periodical relearn cycle, the power supply device may be discharged to zero, and when charging begins, the capacity indicator 354 may show the current power level in the power supply device. While the power level is near bottom, the capacity indicator 354 may blink to indicate that the RAID controller is vulnerable to power outage for that short period of time. Over several years, the power supply device may wear out and the power level will remain low even after a recharge (relearn cycle), the capacity indicator 354 serves to remind users to replace the power supply device to be fully protected from power outage. The relearn indicator 355 is operable to indicate whether a relearn cycle of the power supply device is ongoing. Alternatively and optionally, the relearn indicator 355 may be actuated manually (such as by pressing the relearn actuator or touching the relearn icon) to trigger a relearn cycle. The RAID indicator 356 is operable to indicate whether an error is detected by the RAID controller, which indicates the health status of the RAID controller. The error may be a failure of the RAID controller for example.

These indicators are advantageous in power management for the computing device. Status of the power supply device can be presented on the operation panel and monitored visually and/or audibly by users. Users are therefore able to make timely response, which is particularly useful when abnormality occurs.

Figure 4:
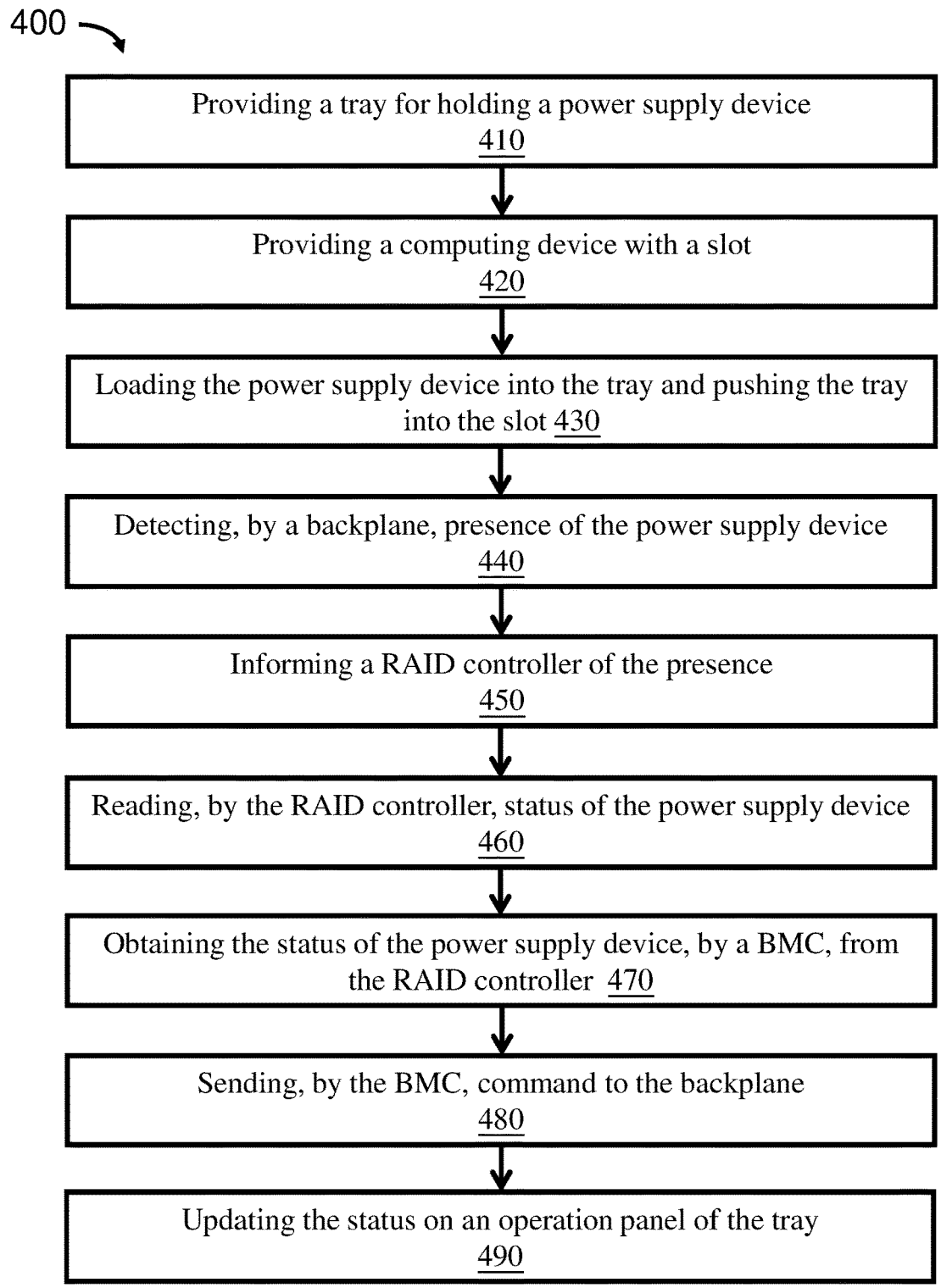
FIG. 4 illustrates a method of installing a power supply device in a computing device in accordance with an embodiment.

FIG. 4 illustrates a method 400 of installing a power supply device in a computing device. The power supply device may be the power supply device 260 as stated above. The computing device may be the computing device 10 or 20 as stated above.

Block 410 states providing a tray for holding the power supply device. The tray may be a specific implementation of the container 142 or 242 as stated above. At least one electrical contact is arranged onto the tray. When being placed or disposed properly in the tray, the power supply device electrically contacts the electrical contact.

Block 420 states providing a computing device. The computing device may be a computer server and defines at least one slot. At block 430, the power supply device is loaded into the tray and the tray is then pushed into the slot such that the electrical contact electrically communicates with the computing device. At block 440, a backplane of the computing device detects whether there is a power supply device in the slot. At block 450, when detecting presence of the power supply device, the backplane informs a RAID controller of the computing device of the presence. At block 460, the RAID controller begins to read the status of the power supply device via the backplane. At block 470, A BMC of the computing device communicates with the RAID controller to obtain the status of the power supply device. After knowing the status of the power supply device, at block 480, the BMC sends command or instructions (e.g. via an I2C bus) to the backplane so that the status of the power supply device is known by the operation panel. That is, the BMC sends command to the backplane to control one or more indicators on the operation panel. At block 490, in response to the command from the BMC, the indicators on the operation panel update their indications, which prompts users to respond accordingly. For example, when the RAID controller has an error or is unable to read status of the power supply device, users may make decision as to inspecting and repairing the RAID controller or replacing the power supply device. If the capacity is below a predefined threshold, such as 50%, users may timely replace the power supply device.

The above embodiments are for illustrative purpose only, it would be appreciated by a person skilled in the art that despite that the container is illustrated in a form of tray in FIG. 1, other kinds of containers with different configurations, such as shapes, may be used. Despite that the at least one electrical contact is disposed on a face of the container as illustrated in FIG. 1, the electrical contact may be arranged in other proper positions according to practical needs, such as on the exterior bottom wall or side walls of the container. Despite that the receiving space includes six slots as illustrated in FIG. 1, the number of slots may be more than six or less than six. The receiving space may also have other configurations, such as shapes, size, etc. Despite that the operation panel is illustrated to include six indicators in FIG. 3, more than six or less than six indicators may be configured. Other kinds of indicators are also possible according to various practical needs. For example, a warning indicator may be included and operable to make a warning sound when the power supply device is detected to work in abnormal condition The receiving space may be newly cutout space or newly formed space in proper manner in a computing device. Alternatively, the apparatus (such as the apparatus 140 and 240) may be designed to be electrically and mechanically compatible with a hard disk storage bay, such as a hard disk slot (a hard disk slot is a slot that is originally designed to hold a hard disk tray in a computing device). As such, the apparatus enables usage of a spare or idle hard disk slot for receiving a power supply device. This is technologically advantageous and cost-effective because no additional structural and electrical adaption or modification for the computing device is required.

Additionally and optionally, the apparatus (such as the apparatus 140 and 240, e.g. a battery tray) as stated above may be designed for holding more than one power supply device. The receiving space may be configured to receive a plurality of such apparatus such that a plurality of power supply devices can be disposed for powering a computing device.

Additionally and optionally, the apparatus (such as the apparatus 140 and 240, e.g. a battery tray) as stated above may be flexibly designed (e.g. shaped) to be compatible with various hard disk storage bays. In some embodiments, the receiving space is configured as a storage bay, and the storage bay includes a subset or subset area for receiving the apparatus. For example, a subset of storage bays may be designated or allocated for receiving battery trays. This provides further flexibility and is advantageous in industrial applications.

It would be appreciated by a person skilled in the art that numerous variations and/or modifications may be made to embodiments as set forth above without departing from the spirit or scope of the exemplary embodiments as broadly constructed. The exemplary embodiments are, therefore, to be considered in all respects as illustrative and non-restrictive.

What is claimed is:

1. An apparatus for holding a power supply device, the power supply device being operable to power a computing device, the apparatus comprising:
   a container configured to hold the power supply device and to be received in a receiving space defined by the computing device, wherein the receiving space is configured to receive a tray for holding a hard disk, and the container, when received in the receiving space, being operable to be removed from the receiving space without necessity of opening a cover of the computing device;
   at least one electrical contact disposed on a rear of the container, wherein the at least one electrical contact is communicatively connectable to a baseboard management controller (BMC) for receipt of signals indicative of a status of the power supply device; and
   an operation panel disposed on a front of the container such that the operation panel is visible to an external operator when received in the receiving space, wherein the operation panel is electrically connected to the at least one contact for receipt of the signals, and wherein the operation panel includes one or more indicators operable to indicate the status of the power supply device based on the received signals and to indicate whether the power supply device is powering the computing device.

2. The apparatus of claim 1, wherein the container is a mechanical tray configured to be receivable in a slot defined by the computing device.

3. The apparatus of claim 1, wherein the container is operable to slide into the receiving space.

4. The apparatus of claim 1, wherein the at least one electrical contact is operable to allow status of the power supply device to be detectable by the computing device.

5. The apparatus of claim 1, wherein the at least one electrical contact includes one or more magnetic pins.

6. The apparatus of claim 1, wherein the operation panel includes:
   a liquid crystal display configured to enable touch input; or
   one or more light emitting diodes buttons.

7. The apparatus of claim 1, wherein the one or more indicators include one or more of the following:
   a health indicator operable to indicate health status of the power supply device;
   a link indicator operable to indicate a link status of the power supply device, the link status indicating whether an electrical connectivity between the power supply device and a Redundant Array of Independent Disks (RAID) controller of the computing device is established to allow the status of the power supply device to be detectable by the RAID controller;
   an activity indicator operable to indicate whether the power supply device is powering the computing device;
   a capacity indicator operable to indicate a current capacity of the power supply device;
   a relearn indicator operable to indicate whether a relearn cycle of the power supply device is ongoing; and
   a RAID indicator operable to indicate whether an error is detected by the RAID controller.

8. A computing device, comprising:
   a Redundant Array of Independent Disks (RAID) controller;
   a baseboard management controller (BMC) configured to communicate with the RAID controller;
   a backplane configured to communicate with the RAID controller and the BMC and including one or more connectors, the one or more connectors being operable to electrically contact one or more pins of an apparatus for holding a power supply device, wherein the one or more connectors provide signals indicative of a status of the power supply device;
   the computing device further defining a receiving space configured to receive the apparatus, and when the apparatus, with the power supply device, is received in the receiving space, status of the power supply device being readable by the BMC via the RAID controller, wherein the receiving space is configured to receive a tray for holding a hard disk; and an operation panel disposed in a front of the receiving space such that the operation panel is visible to an external operator when received in the receiving space, wherein the operation panel is electrical connected to the one or more pins of the apparatus for receipt of the signals, wherein the operation panel includes one or more indicators operable to indicate the status of the power supply device and to indicate whether the power supply device is powering the computing device based on the signals.

9. The computing device of claim 8, wherein the receiving space is configured as a storage bay, and the storage bay includes a subset area configured to receive the apparatus.

10. The computing device of claim 8, wherein the BMC is operable to send command to the backplane to control one or more indicators on an operation panel of the apparatus.

11. The computing device of claim 8, wherein the computing device is a computer server.

12. The computing device of claim 8, wherein the one or more pins are magnetic pins.

13. A method of installing a power supply device in a computing device, the method comprising:

providing an apparatus for holding the power supply device, the apparatus including a container and at least one electrical contact, wherein the at least one electrical contact is communicatively connectable to a baseboard management controller (BMC) of the computing device for receipt of signals indicative of a status of the power supply device, wherein the container is configured to hold the power supply device and to be received in a receiving space defined by the computing device, wherein the apparatus comprises an operation panel disposed on a front of the container such that the operation panel is visible to an external operator when received in the receiving space, wherein the operation panel is electrically connected to the at least one contact for receipt of the signals, wherein the operation panel includes one or more indicators operable to indicate status of the power supply device based on the received signals and to indicate whether the power supply device is powering the computing device; and installing the apparatus into a receiving space defined by the computing device such that the at least one electrical contact electrically communicates with the computing device, wherein the receiving space is configured to receive a tray for holding a hard disk.

14. The method of claim 13, wherein the power supply device comprises a battery or supercapacitor.

15. The method of claim 13, further comprising:

reading, by a Redundant Array of Independent Disks (RAID) controller of the computing device, status of the power supply device via a backplane of the computing device;

obtaining, by the BMC, the status of the power supply device from the RAID controller; and sending, by the BMC, command to the backplane so that the status of the power supply device is displayed on an operation panel of the apparatus.

16. The method of claim 15, further comprising before the reading step:

detecting, by the backplane, presence of the power supply device in the receiving space; and informing, by the backplane and when the presence of the power supply device is detected, the RAID controller of the presence.

17. The method of claim 13, further comprising displaying, on the operation panel, one or more of the following:

an indication indicating health status of the power supply device;

an indication indicating link status of the power supply device, the link status indicating whether an electrical connectivity between the power supply device communicates and the RAID controller is established to allow the status of the power supply device to be read by the RAID controller;

an indication indicating whether the power supply device is powering the computing device;

an indication indicating a current capacity of the power supply device;

an indication indicating whether a relearn cycle of the power supply device is ongoing; and an indication indicating whether an error is detected by the RAID controller.

18. The method of claim 13, further comprising when the capacity of the power supply device is below a predefined threshold, replacing the power supply device by pulling the apparatus out of the receiving space without opening a cover of the computing device.

* * * * *